(12) United States Patent
Macheiner

(10) Patent No.: US 11,145,578 B2
(45) Date of Patent: Oct. 12, 2021

(54) SEMICONDUCTOR PACKAGE WITH TOP OR BOTTOM SIDE COOLING AND METHOD FOR MANUFACTURING THE SEMICONDUCTOR PACKAGE

(71) Applicant: Infineon Technologies AG, Neubiberg (DE)

(72) Inventor: Stefan Macheiner, Kissing (DE)

(73) Assignee: Infineon Technologies AG, Neubiberg (DE)

( * ) Notice: Subject to any disclaimer, the term of this patent is extended or adjusted under 35 U.S.C. 154(b) by 41 days.

(21) Appl. No.: 16/580,748

(22) Filed: Sep. 24, 2019

(65) Prior Publication Data

US 2021/0090979 A1 Mar. 25, 2021

(51) Int. Cl.
*H01L 23/495* (2006.01)
*H01L 23/31* (2006.01)
*H01L 21/56* (2006.01)
*H01L 21/48* (2006.01)

(52) U.S. Cl.
CPC .... *H01L 23/49568* (2013.01); *H01L 21/4825* (2013.01); *H01L 21/565* (2013.01); *H01L 23/3114* (2013.01); *H01L 23/4952* (2013.01); *H01L 23/49503* (2013.01); *H01L 23/49562* (2013.01)

(58) Field of Classification Search
CPC ... H01L 21/56; H01L 21/565; H01L 21/4825; H01L 23/49568; H01L 23/49503; H01L 23/3114; H01L 23/4903; H01L 23/4951; H01L 29/13055; H01L 29/13064; H01L 29/13091; H01L 2924/13055; H01L 2924/13091; H01L 2924/13064; H01L 23/367; H01L 23/3677; H01L 23/4825; H01L 23/4952
See application file for complete search history.

(56) References Cited

U.S. PATENT DOCUMENTS

| 9,214,415 | B2 * | 12/2015 | Denison | H01L 21/50 |
| 2009/0127677 | A1 | 5/2009 | Gomez | |
| 2009/0294934 | A1 | 12/2009 | Shi et al. | |
| 2010/0006995 | A1 * | 1/2010 | Kasuya | H01L 23/562 257/676 |

(Continued)

FOREIGN PATENT DOCUMENTS

EP 3026701 A1 6/2016
JP 2004273977 A 9/2004

*Primary Examiner* — Khiem D Nguyen
(74) *Attorney, Agent, or Firm* — Murphy, Bilak & Homiller, PLLC

(57) ABSTRACT

A package includes a semiconductor die having a first load terminal at a first side and a second load terminal at a second side opposite the first side, a metal block attached to the second load terminal and providing a single primary thermal conduction path of the package, a first metal lead electrically connected to the first load terminal, a second metal lead electrically connected to the second load terminal, and a mold compound embedding the semiconductor die, the metal block, and each metal lead. Each metal lead and the metal block are exposed from the mold compound at a first side of the package. Each metal lead is exposed from the mold compound at a second side of the package opposite the first side, so that the package is configured for surface mounting at either the first side or the second side of the package.

20 Claims, 9 Drawing Sheets

(56) References Cited

U.S. PATENT DOCUMENTS

| | | | |
|---|---|---|---|
| 2010/0133670 A1* | 6/2010 | Liu | H01L 23/49524 |
| | | | 257/675 |
| 2012/0256239 A1 | 10/2012 | Herbsommer et al. | |
| 2013/0256856 A1* | 10/2013 | Mahler | H01L 24/84 |
| | | | 257/676 |
| 2013/0341777 A1* | 12/2013 | Otremba | H01L 23/49562 |
| | | | 257/675 |
| 2014/0329361 A1* | 11/2014 | Heinrich | H01L 24/03 |
| | | | 438/123 |
| 2017/0170144 A1* | 6/2017 | Williams | H01L 23/4952 |

* cited by examiner

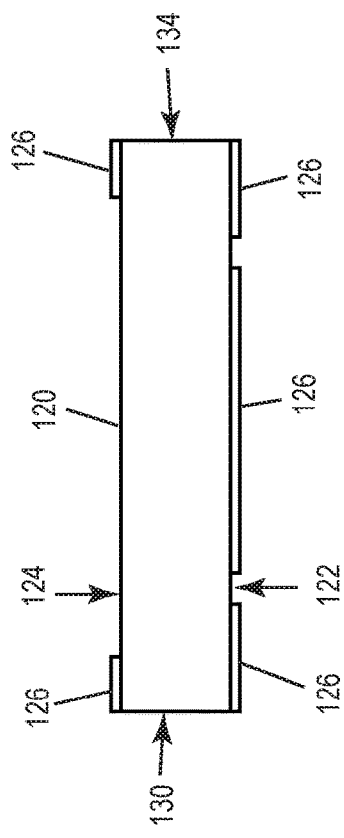
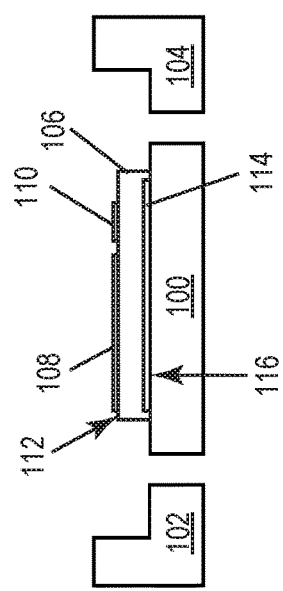
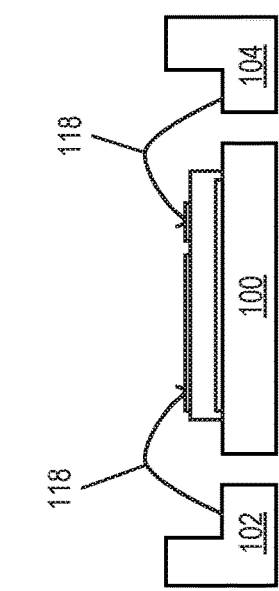
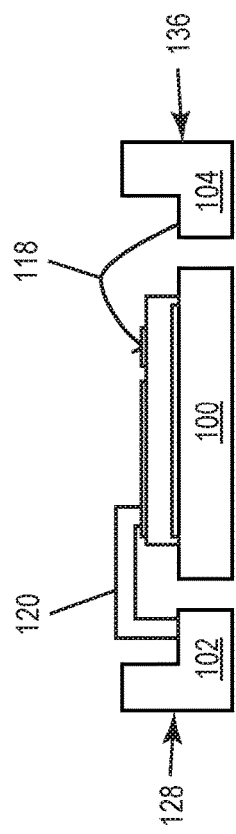
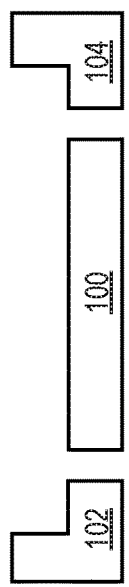
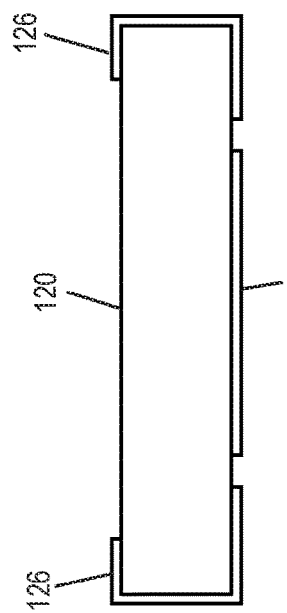

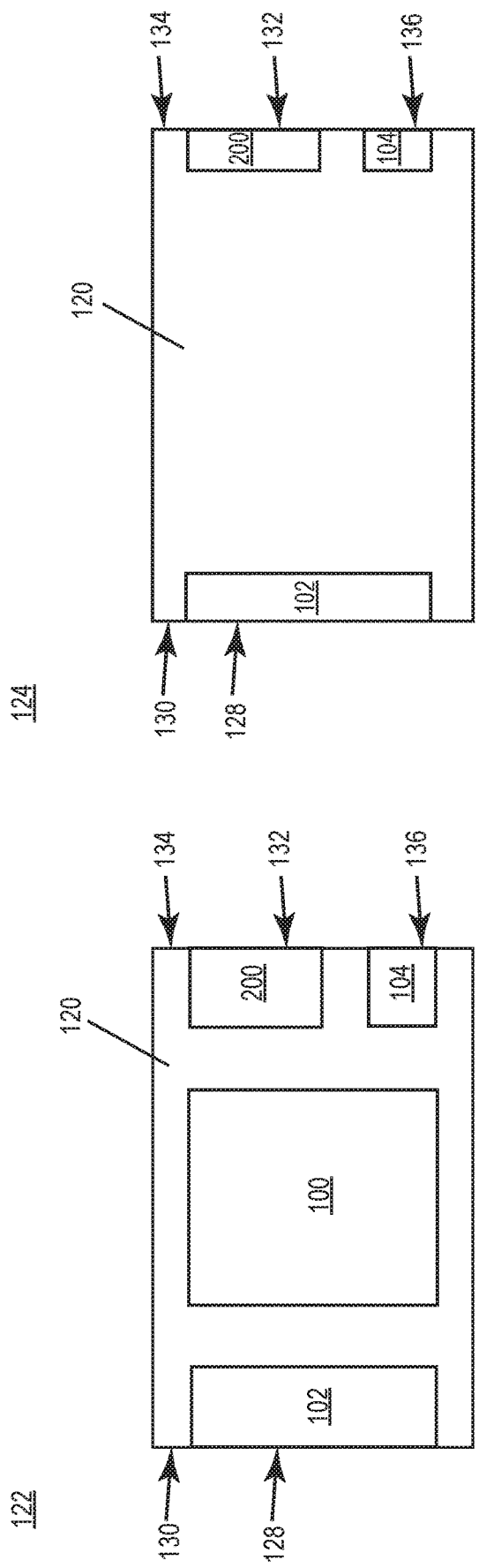

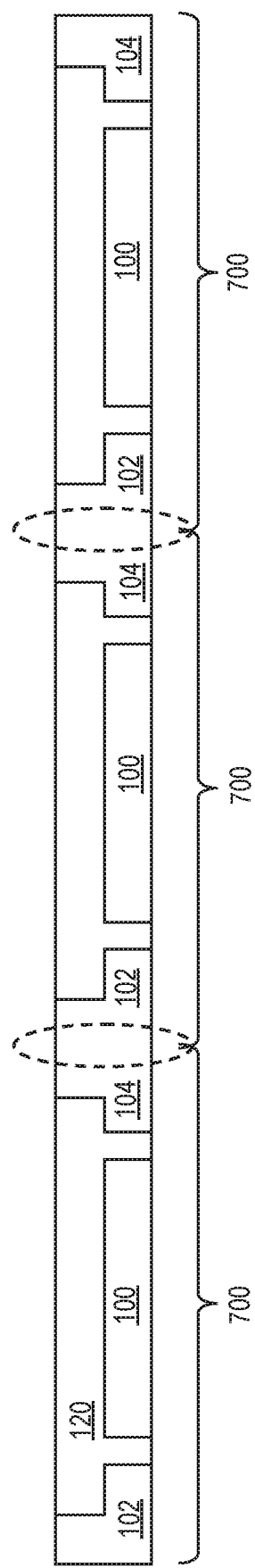
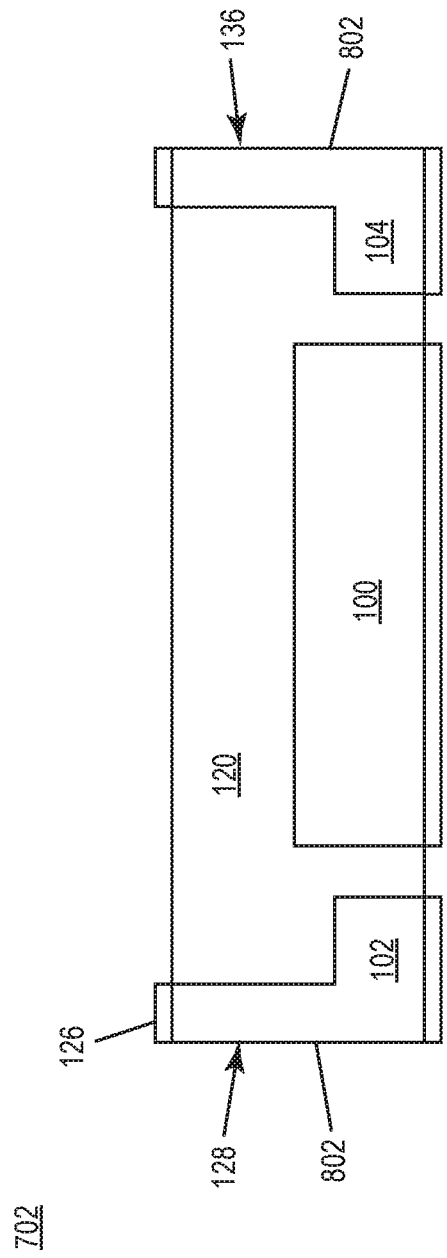
Figure 7A
Figure 7B

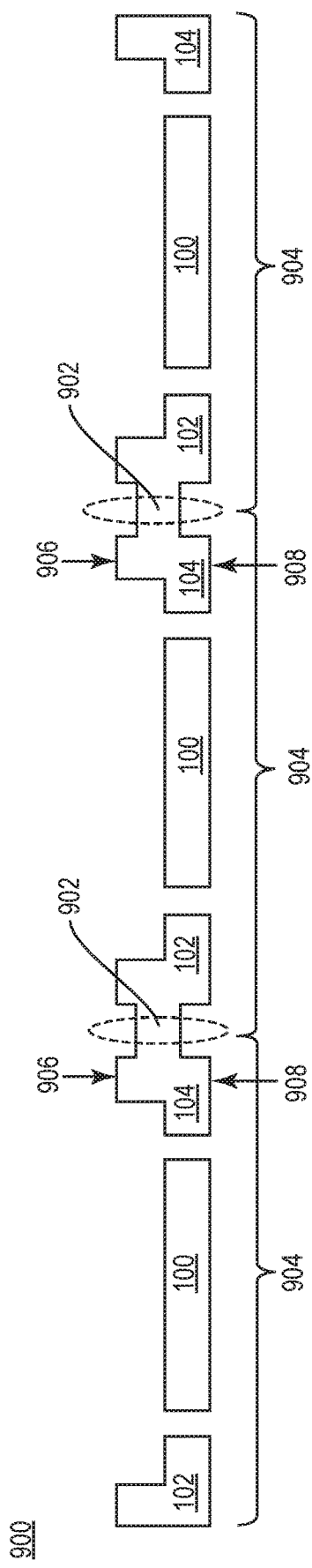
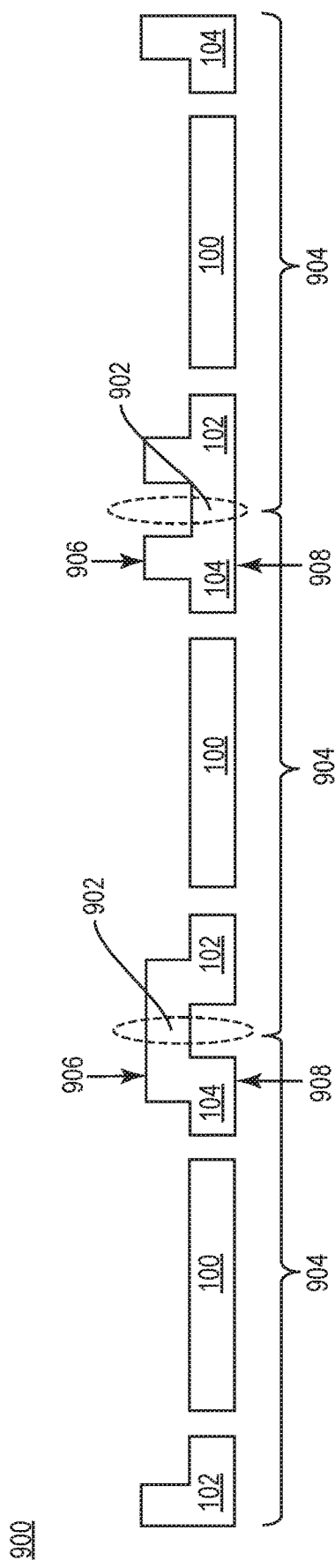

SEMICONDUCTOR PACKAGE WITH TOP OR BOTTOM SIDE COOLING AND METHOD FOR MANUFACTURING THE SEMICONDUCTOR PACKAGE

BACKGROUND

For many applications, heat dissipation into a PCB (printed circuit board) has reached a thermal overload limit. DSC (double side cool) packages still have a significant part of the heat flowing into a PCB, thus limiting the application of DSC packages. TSC (top side cool) packages carry heat away from a PCB and are an option to address the PCB thermal overload issue, but present significant challenges in implementing effective cooling.

Thus, there is a need for an improved semiconductor package and a method for producing such a semiconductor package.

SUMMARY

According to an embodiment of a package, the package comprises: a semiconductor die having a first load terminal at a first side of the semiconductor die and a second load terminal at a second side of the semiconductor die opposite the first side; a metal block attached to the second load terminal of the semiconductor die and providing a single primary thermal conduction path of the package; a first metal lead electrically connected to the first load terminal of the semiconductor die; a second metal lead electrically connected to the second load terminal of the semiconductor die; and a mold compound embedding the semiconductor die, the metal block, and each metal lead, wherein each metal lead and the metal block are exposed from the mold compound at a first side of the package, wherein each metal lead is exposed from the mold compound at a second side of the package opposite the first side, so that the package is configured for surface mounting at either the first side or the second side of the package.

According to an embodiment of a method of producing a package, the method comprises: attaching a second load terminal at a second side of a semiconductor die to a metal block which provides a single primary thermal conduction path of the package, the semiconductor die having a first load terminal at a first side of the semiconductor die opposite the second side; electrically connecting a first metal lead to the first load terminal of the semiconductor die; electrically connecting a second metal lead to the second load terminal of the semiconductor die; and embedding the semiconductor die, the metal block, and each metal lead in a mold compound, wherein each metal lead and the metal block are exposed from the mold compound at a first side of the package, wherein each metal lead is exposed from the mold compound at a second side of the package opposite the first side, so that the package is configured for surface mounting at either the first side or the second side of the package.

According to an embodiment of an electronic assembly, the electronic assembly comprises: a package and a substrate to which the package is surface mounted at either a first side or a second side of the package. The package comprises: a semiconductor die having a first load terminal at a first side of the semiconductor die and a second load terminal at a second side of the semiconductor die opposite the first side; a metal block attached to the second load terminal of the semiconductor die and providing a single primary thermal conduction path of the package; a first metal lead electrically connected to the first load terminal of the semiconductor die; a second metal lead electrically connected to the second load terminal of the semiconductor die: and a mold compound embedding the semiconductor die, the metal block, and each metal lead, wherein each metal lead and the metal block are exposed from the mold compound at the first side of the package, wherein each metal lead is exposed from the mold compound at the second side of the package, so that the package is configured for surface mounting at either the first side or the second side of the package.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

FIGS. 1A through 1F illustrate respective cross-sectional views during different stages of a method of producing a semiconductor package configured for top or bottom side cooling.

FIG. 2A shows a bottom view of the semiconductor package upon completion of the production method.

FIG. 2B shows a corresponding top view of the package.

FIG. 7A illustrates a cross-sectional view of an embodiment of singulating individual semiconductor packages configured for top or bottom side cooling, and which are produced at the same time.

FIG. 7B illustrates a cross-sectional view of an embodiment of an individual package produced by the singulation method illustrated in FIG. 7A.

FIG. 9 illustrates a cross-sectional view of an embodiment of a leadframe sheet from which the package illustrated in FIG. 8 can be produced.

FIG. 10 illustrates a cross-sectional view of another embodiment of a leadframe sheet from which the package illustrated in FIG. 8 can be produced.

DETAILED DESCRIPTION

Figure 4A:
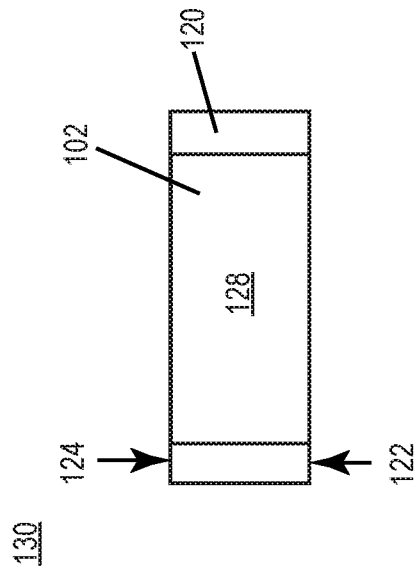
FIG. 4A shows a first edge face of the final package post molding.

The embodiments described herein provide a semiconductor package configured for top or bottom side cooling.

The semiconductor package has a single primary thermal conduction path, and is mountable to a board at either the top or bottom side. The mounting configuration and which side of the package heat is to be removed from are selections that may be made without requiring a redesign of the package, thereby accommodating different mounting and heat removal configurations with the same package. The term "single primary thermal conduction path" as used herein means that this path brings out more than 50% of the heat generated by the component(s) within the package.

FIGS. 1A through 1F illustrate respective cross-sectional views during different stages of a method of producing a semiconductor package configured for top or bottom side cooling. FIG. 2A shows a bottom view of the semiconductor package upon completion of the production method, and FIG. 2B shows a corresponding top view of the package.

FIG. 1A shows a metal block 100 and metal leads 102, 104. The metal block 100 is configured for attachment of one or more semiconductor dies to the metal block 100. The metal leads 102, 104 are configured for providing electrical connections to the one or more semiconductor dies attached to the metal block 100. In one embodiment, the metal block 100 and the metal leads 102, 104 are part of a leadframe. According to this embodiment, the metal block 100 forms a die pad for receiving one or more semiconductor dies. The leadframe may be formed, e.g., by stamping and/or etching. In other embodiments, the metal block 100 and metal leads 102, 104 are not part of a leadframe but may instead be discrete metal parts. In each case the metal block 100 provides a single primary thermal conduction path of the package.

FIG. 1B shows at least one semiconductor die 106 attached to the metal block 100. The semiconductor die 106 has a first load terminal 108 and a control terminal 110 at the front side 112 of the semiconductor die 106, and a second load terminal 114 at the back side 116 of the semiconductor die 106. The second load terminal 114 at the back side 116 of the semiconductor die 106 is attached and electrically connected to the metal block 100 which provides the single primary thermal conduction path of the package, according to an embodiment. In other configurations, no electrical contact is needed but only a thermal contact. In that case, an electrically insulating die attach may be used.

In one embodiment, the semiconductor die 106 is a power semiconductor die such as a power MOSFET (metal-oxide-semiconductor field effect transistor), IGBT (insulated gate bipolar transistor), HEMT (high-electron mobility transistor), etc. In the case of a power MOSFET or HEMT, the load terminal 114 at the back side 116 of the semiconductor die 106 may be a drain terminal and the load terminal 108 at the front side 112 of the die 106 may be a source terminal. In the case of an IGBT, the load terminal 114 at the back side 116 of the semiconductor die 106 may be a collector terminal and the load terminal 108 at the front side 112 of the die 106 may be an emitter terminal. In either case, the control terminal 110 may be a gate terminal.

FIG. 1C shows a first metal lead 102 electrically connected to the first load terminal 108 at the front side 112 of the semiconductor die 106. A second metal lead 200, which is out of view in FIGS. 1A through 1F, is electrically connected to the second load terminal 114 at the back side 116 of the semiconductor die 106. A third metal lead 104 is electrically connected to the control terminal 110 at the front side 112 of the semiconductor die 106. Exposed parts of all three metal leads 102, 104, 200 are visible in FIGS. 2A and 2B, which show a bottom view (FIG. 2A) and a corresponding top view (FIG. 2B) of the semiconductor package upon completion of the production method.

In FIG. 1C, the electrical connections between the metal leads 102, 104 and the respective terminals 108, 110 at the front side 112 of the semiconductor die 106 are formed by bond wire connections 118. Some or all of these electrical connections may instead be formed by metal ribbons, metal clips, etc.

FIG. 1D shows an alternative embodiment in which the first metal lead 102 is electrically connected to the first load terminal 108 at the front side 112 of the semiconductor die 106 by a metal clip 120 instead of bond wires.

FIG. 1E shows the semiconductor die 106, the metal block 100, and each metal lead 102, 104, 200 embedded in a mold compound 122. Each metal lead 102, 104, 200 and the metal block 100 are exposed from the mold compound 120 at a first main side 122 of the package as shown in FIG. 2A and at a second main side 124 of the package opposite the first main side 122 as shown in FIG. 2B, so that the package is configured for surface mounting at either main side 122, 124 of the package. Typical mold compounds and resins include, but are not limited to, thermoset resins, gel elastomers, encapsulants, potting compounds, composites, optical grade materials, etc. The exposed parts of the metal leads 102, 104, 200 and metal block 100 may be plated may be plated with metal 126 to provide wettable contacts at both main sides 122, 124 of the package.

In one embodiment, the first metal lead 102 has a sidewall 128 which extends from the first main side 122 of the package to the second main side 124 of the package at a first edge face 130 of the package. The second metal lead 200 similarly has a sidewall 132 which extends from the first main side 122 of the package to the second main side 124 of the package at a second edge face 134 of the package different from the first edge face 130. The sidewall 128 of the first metal lead 102 and the sidewall 132 of the second metal lead 200 are both at least partly exposed from the mold compound 120. The third metal lead 104 electrically connected to the control terminal 110 at the front side 112 of the semiconductor die 106 may have a similar configuration. That is, the third metal lead 104 may have a sidewall 136 which extends from the first main side 122 of the package to the second main side 124 of the package at the second edge face 134 of the package and be at least partly exposed from the mold compound 120.

FIG. 1F shows an alternative embodiment in which the part of the sidewall 128, 132, 136 of each metal lead 102, 104, 200 at least partly exposed from the mold compound 120 is plated with metal 126 at the edge faces 130, 134 of the package, providing wettable contacts at two or more edge faces 130, 134 of the package.

Figure 4B:
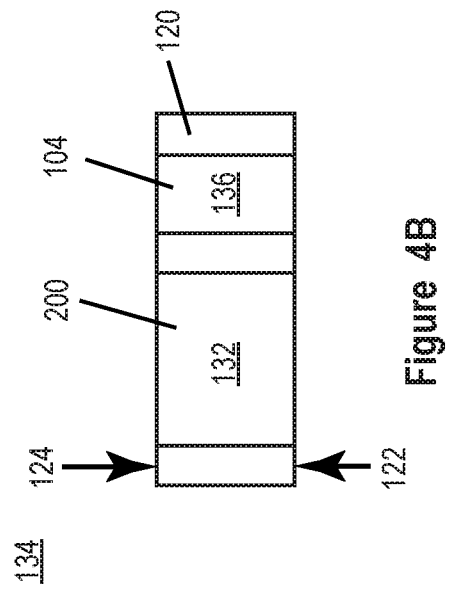
FIG. 4I shows a second edge face of the final package post molding.
Figure 3:
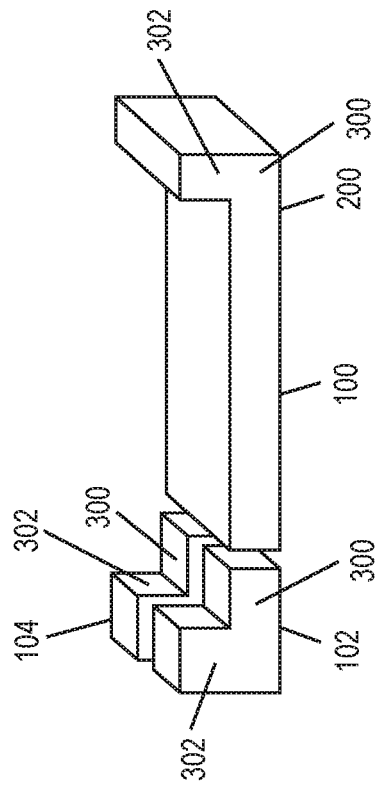
FIG. 3 illustrates a side perspective view of a metal block and metal leads of the package prior to die attachment, according to an embodiment.

FIG. 3 illustrates a side perspective view of the metal block 100 and the metal leads 102, 104, 200 of the package prior to die attachment, according to an embodiment. FIG. 4A shows the first edge face 130 of the final package post molding, and FIG. 4B shows the second edge face 134 of the final package post molding.

In FIG. 3, the metal leads 102, 104, 200 each have a base 300 and a branch 302 extending from the base 300. For example, at least some of the metal leads 102, 104, 200 may be L-shaped. Separately or in combination, the metal block 100 which provides the single primary thermal conduction path of the package and the second metal lead 200 electrically connected to the metal block 100 may be fused together or formed integrally to yield the electrical connection between the second metal lead 200 and the second load terminal 114 at the back side 116 of the semiconductor die 106.

As shown in FIG. 4A, the first metal lead 102 has a sidewall 128 which extends from the first main side 122 of the package to the second main side 124 of the package at the first edge face 130 of the package.

As shown in FIG. 4, the second metal lead 200 and the third metal lead 104 may each have a sidewall 132, 136 which extends from the first main side 122 of the package to the second main side 124 of the package at the second edge face 134 of the package. The third metal lead 104 may instead be disposed at the same edge face 130 as the first metal lead 102.

In either case, the sidewalls 128, 132, 136 of the metal leads 102, 200, 104 may be at least partly exposed from the mold compound 120. In one embodiment, the entire sidewall of the first metal lead 102 is exposed from the mold compound 120 and forms part of the first edge face 130 of the package, and the entire sidewall 132 of the second metal lead 200 is exposed from the mold compound 120 and forms part of the second edge face 134 of the package. The part of the sidewall 128, 132, 136 of each metal lead 102, 200, 104 at least partly exposed from the mold compound 120 may be plated, e.g., as shown in FIG. 1F, providing wettable contacts at two or more edge faces 130, 134 of the package.

Figure 5:
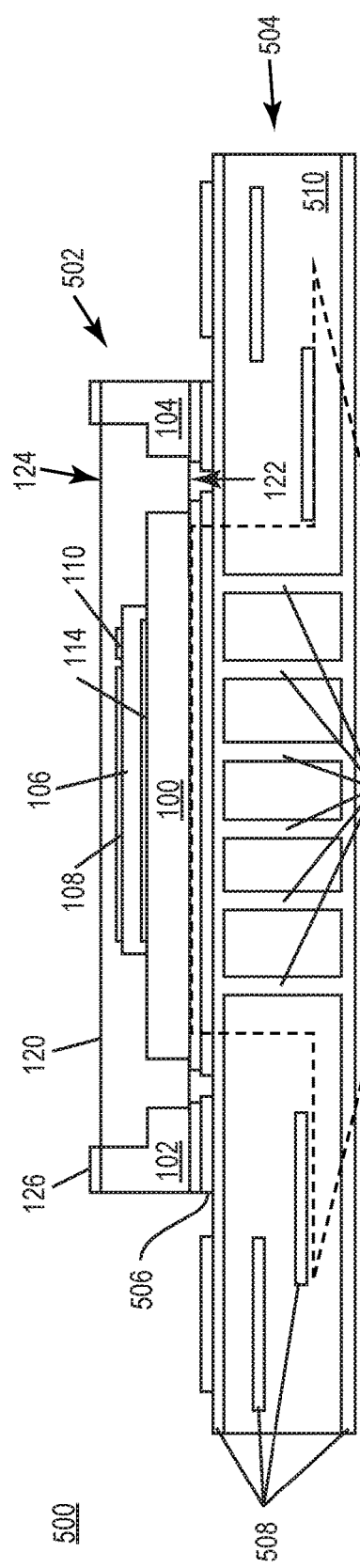
FIG. 5 illustrates a cross-sectional view of an embodiment of an electronic assembly that includes the package and a substrate to which the package is surface mounted.

FIG. 5 illustrates an embodiment of an electronic assembly 500 that includes a package 502 and a substrate 504 to which the package 502 is surface mounted, e.g., via solder joints 506. The substrate 504 may be a PCB, for example, and which may include conductive tracks, pads and other features 508 etched from one or more sheet layers of copper laminated onto and/or between sheet layers of a non-conductive substrate 510.

The package 502 is of the kind previously described herein. That is, the package 502 is configured for top or bottom side cooling and includes at least one semiconductor die 106 having a first load terminal 108 and a control terminal 110 at a front side of the semiconductor die 106 and a second load terminal 114 at a back side of the semiconductor die 106. The package 502 also includes a metal block 100 attached to the second load terminal 114 of the semiconductor die 106 and providing a single primary thermal conduction path of the package 502, a first metal lead 102 electrically connected to the first load terminal 108 of the die 106, a second metal lead (element 200 in FIGS. 2A-2B, 3 and 4B) electrically connected to the second load terminal 114 of the die 106, a third metal lead 104 electrically connected to the control terminal of the die, and a mold compound 120 embedding the semiconductor die 106, the metal block 100, and the metal leads 102, 104. The electrical connections between the die terminals 108, 110, 114 and the respective metal leads 102, 104, 200 are not shown in FIG. 5 for ease of illustration. In the case of the electrical connections to the first load terminal 108 and the control terminal 110 at the front side of the semiconductor die 106, the electrical connections may be implemented as bond wires, metal ribbons, metal clips, etc., as previously described herein. In the case of the electrical connection between the second metal lead 200 and the second load terminal 114 at the back side of the semiconductor die 106, the electrical connection may be implemented as bond wires, metal ribbons, metal clips, etc. Alternatively, the metal block 100 and the second metal lead 200 may be fused together or formed integrally to form the electrical connection between the second metal lead 200 and the second load terminal 114 of the semiconductor die 106, also as previously explained herein.

Each metal lead 102, 104, 200 and the metal block 100 are exposed from the mold compound 120 at a first main side 122 of the package 502. Each metal lead 102, 104, 200 is exposed from the mold compound 120 at a second main side 124 of the package 502 opposite the first main side 122, so that the package 502 is configured for surface mounting at either the first or second main side 122, 124 of the package 504.

According to the embodiment illustrated in FIG. 5, the first main side 122 of the package 502 is surface mounted to the substrate 504. Accordingly, the second load terminal 114 at the back side of the semiconductor die 106 included in the package 502 faces the substrate 504 and the single primary thermal conduction path of the package 502 provided by the metal block 100 is conducted into the substrate 502 as indicated by the dashed downward-facing arrow in FIG. 5. The substrate 504 may include metal structures 512 such as metal pillars, a heat slug, etc. for carrying the heat energy to the opposite side of the substrate 504 to which the package 502 is attached.

Figure 6:
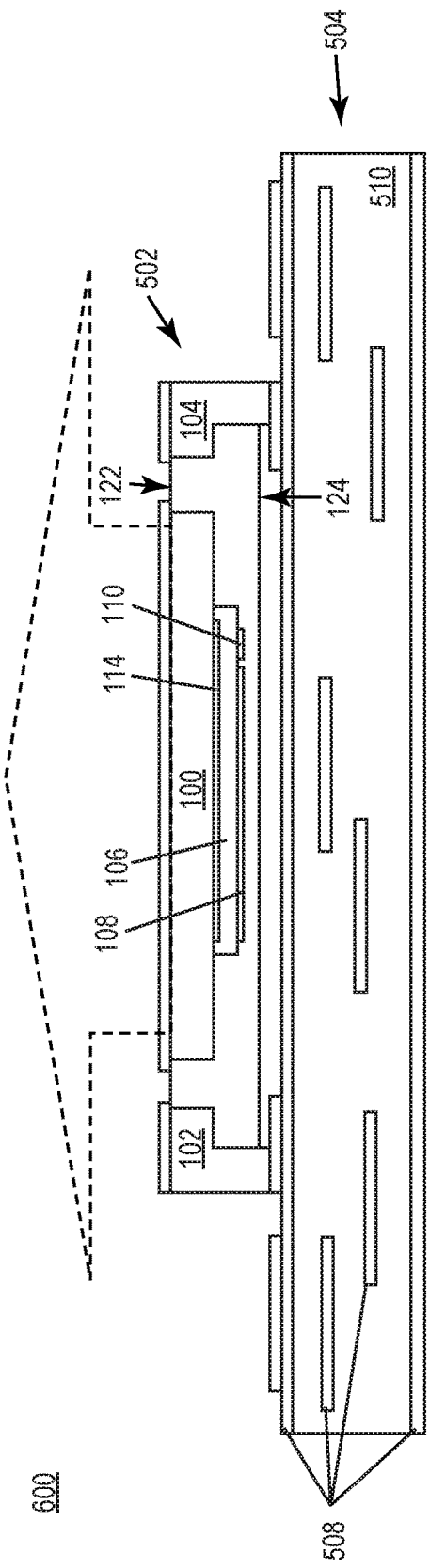
FIG. 6 illustrates a cross-sectional view of another embodiment of an electronic assembly that includes the package and a substrate to which the package is surface mounted.

FIG. 6 illustrates another embodiment of an electronic assembly 500 that includes a package 502 and a substrate 504 to which the package 502 is surface mounted. The embodiment illustrated in FIG. 6 is similar to the embodiment illustrated in FIG. 5. Different, however, the second main side 124 of the package 502 is surface mounted to the substrate 504 instead of the first main side 122. According to this embodiment, the first load terminal 108 and the control terminal 110 at the front side of the semiconductor die 106 included in the package 502 faces the substrate 504 and the single primary thermal conduction path of the package 502 provided by the metal block 100 is conducted away from the substrate 504 as indicated by the dashed upward-facing arrow in FIG. 6. Accordingly, most of the heat energy generated by the semiconductor die 106 included in the package 502, e.g., up to 90% or more, is directed away from the substrate 504 for dissipation. Although not shown in FIG. 6 for ease of illustration, a cooling element may be attached to the first main side 122 of the package 502 to enhance heat dissipation.

FIG. 7A illustrates an embodiment of singulating individual semiconductor packages of the kind described herein and which are produced at the same time. The semiconductor dies and corresponding electrical connections to the semiconductor dies are not shown in FIG. 7A for ease of illustration. In FIG. 7A, a plurality of packages 700 are molded at the same time. After molding, the packages 700 are singulated into individual packages. The packages 700 are singulated by dicing, sawing, laser cutting, etc., in the regions indicated by the dashed ovals in FIG. 7A.

FIG. 7B illustrates an embodiment of an individual package 702 produced by the singulation method shown in FIG. 7A. The semiconductor die and corresponding electrical connections to the semiconductor dies are not shown in FIG. 7A for ease of illustration. According to the embodiment illustrated in FIG. 7A, the entire sidewall 128, 132, 136 of each metal lead 102, 200, 104 is fully exposed from the mold compound 120 due to the single-cut singulation method employed in FIG. 7A. The second metal lead 200 is out of view in FIG. 7B, but is visible in FIGS. 2A-2B, 3 and 4B. The fully exposed sidewalls 128, 132, 136 of the metal leads 102, 200, 104 are not plated with metal in this embodiment.

Figure 8:
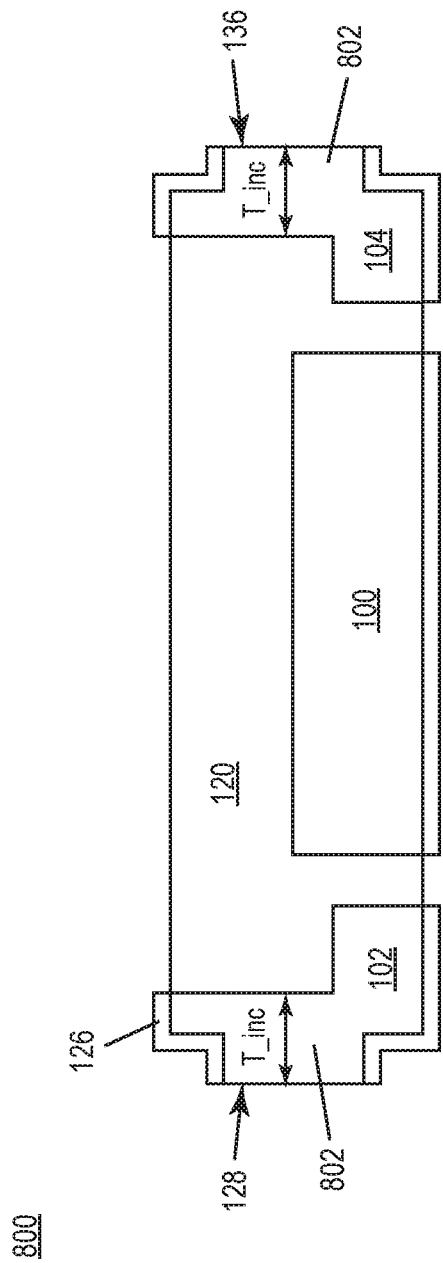
FIG. 8 illustrates a cross-sectional view of an embodiment of a singulated package configured for top or bottom side cooling.

FIG. 8 illustrates an embodiment of a singulated package 800 of the kind described herein. The semiconductor die and corresponding electrical connections to the semiconductor dies are not shown in FIG. 8 for ease of illustration. According to the embodiment illustrated in FIG. 8, the part of the sidewall 128, 132, 136 of each metal lead 102, 200, 104 at least partly exposed from the mold compound 120 is a protuberance 802 such that the sidewall 128, 132, 134 of each metal lead 102, 200, 104 has an increased local thickness (T_inc) in a region of the protuberance 802. The second metal lead 200 is out of view in FIG. 8, but is visible in FIGS. 2A-2B, 3 and 4B. The protuberances 802 may or may not be plated with metal.

FIGS. 9 and 10 illustrate respective embodiments of a leadframe sheet 900 from which the package 800 illustrated in FIG. 8 can be produced.

In FIG. 9, the protuberances 802 are formed by dicing, sawing, laser cutting, etc. through a metal region 902 which connects conjoined metal leads 102, 104 of adjacent leadframes 904. The joining metal region 902 which is separated by the singulation process is positioned lower than the top surface 906 and higher than the bottom surface 908 of the conjoined metal leads 102, 104, so that the protuberances 802 formed by the singulation process have a step down from the top surface 906 and a step up from the bottom surface 908 of the corresponding metal lead 102, 200, 104. The joining metal regions 902 are cut by dicing, sawing, laser cutting, etc. in the regions indicated by the dashed ovals in FIG. 9. The second metal leads 200, which may be conjoined with an adjacent metal lead in a similar manner, are out of view in FIG. 9 but is visible in FIGS. 2A-2B, 3 and 4B.

In FIG. 10, the protuberances 802 are again formed by dicing, sawing, laser cutting, etc. through a metal region 902 which connects conjoined metal leads 102, 104 of adjacent leadframes 904. Different than FIG. 9, the joining metal region 902 which is separated by the singulation process is at the same level as the top surface 906 (left-hand side) or the bottom surface 908 (right-hand side) of the conjoined metal leads 102, 104 of the leadframes 904, so that the protuberances 802 formed by the singulation process have only a step up (left-hand side) from the bottom surface 908 or a step down (right-hand side) from the top surface 906 of the corresponding metal lead 102, 200, 104. The joining metal regions 902 are cut by dicing, sawing, laser cutting, etc. in the regions indicated by the dashed ovals in FIG. 10. The second metal leads 200, which may be conjoined with an adjacent metal lead in a similar manner, are out of view in FIG. 10 but is visible in FIGS. 2A-2B, 3 and 4B.

FIGS. 11A through 11D illustrate another embodiment of cutting through the metal region 902 which connects conjoined metal leads 102/200/104, 104/200/102 of adjacent packages after the molding process. The cutting may be done by dicing, sawing, laser cutting, etc.

Figure 11A:
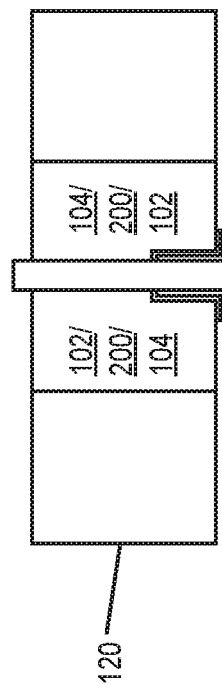
FIGS. 11A through 11D illustrate respective cross-sectional views during different stages of a method of singulating semiconductor packages each of which is configured for top or bottom side cooling.

FIG. 11A shows an initial, partial cut made in the metal region 902 which connects the conjoined metal leads 102/200/104, 104/200/102 using a wider blade 1100.

Figure 11B:
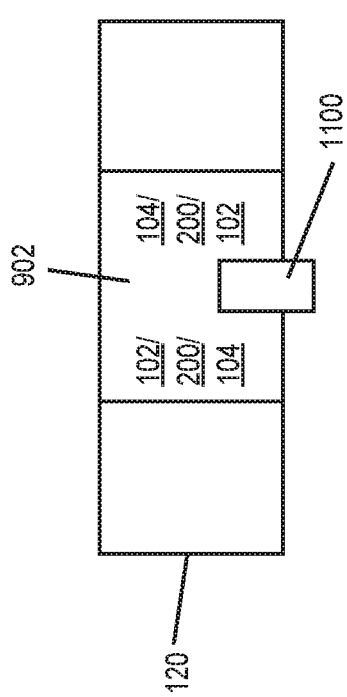

FIG. 11B shows the sidewalls and bottom of the initial cut 1102 plated with metal 1104.

Figure 11C:
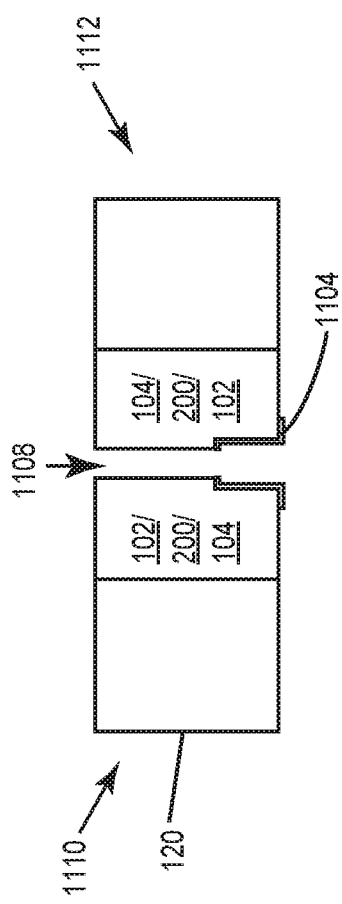
Figure 11D:
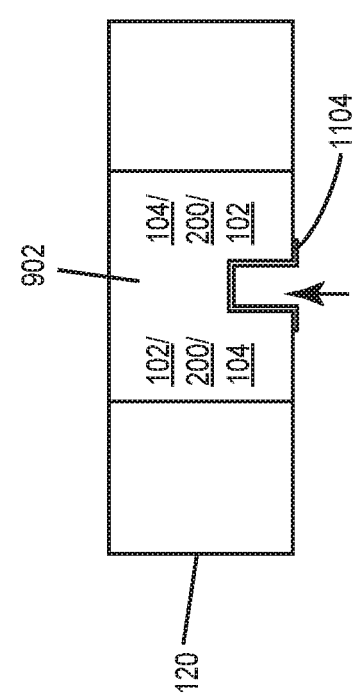

FIGS. 11C and 11D show a second cut 1108 made in the metal region 902 which connects conjoined metal leads 102/200/104, 104/200/102 using a narrower blade 1106. The second cut 1108 is therefore narrower than the first cut 1102. The metal plating 1104 remains on the part of sidewalls of the separated metal leads 102/200/104, 104/200/102 formed by the first cut 1102, but not on the part of the sidewalls of the separated metal leads 102/200/104, 104/200/102 formed by the second cut 1108. The plating process may instead be performed after both cuts 1102, 1108 are made so that the entire sidewalls of the separated metal leads 102/200/104, 104/200/102 are plated with metal.

FIG. 11D shows part of two adjacent, molded packages 1110, 1112 after being separated from one another along the region where the conjoined metal leads 102/200/104 were cut through.

The semiconductor packages described herein need not be limited limit to two or three leads, e.g., in the case of a MOSFET, IGBT or HEMT package. The embodiments previously described herein are readily extendible to more complex IC packages.

Figure 12:
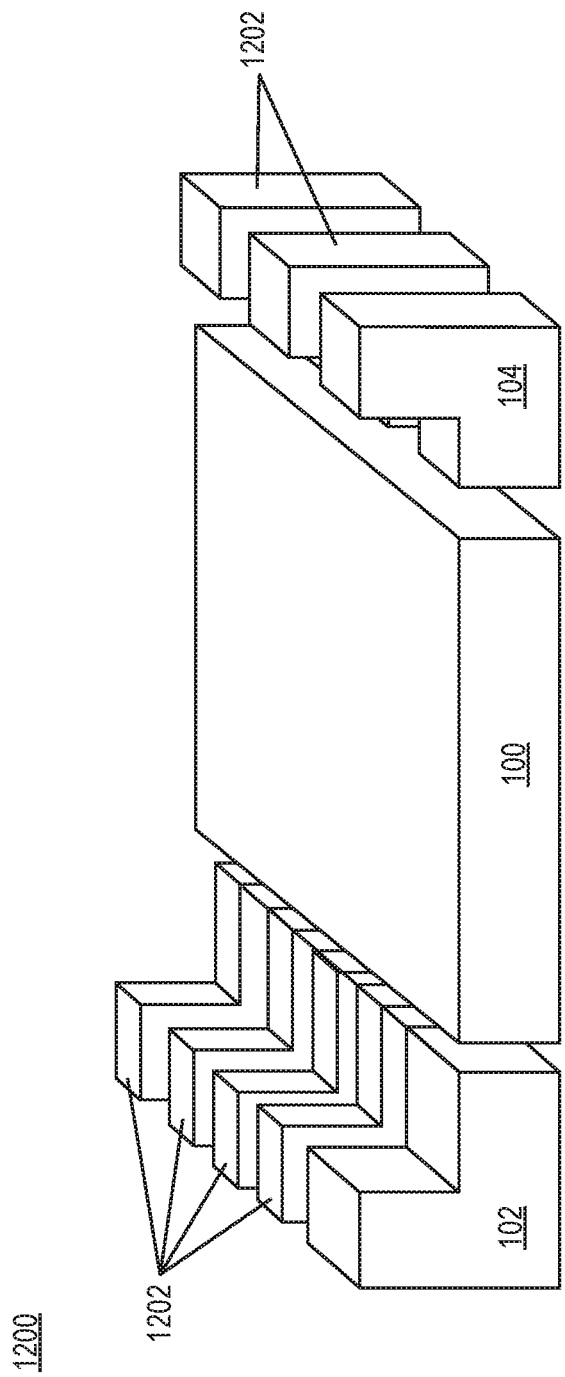
FIG. 12 illustrates a side perspective view of a leadframe of the package prior to die attachment, according to an embodiment.

FIG. 12, for example, shows an embodiment of a leadframe or similar structure 1200 having the metal block 100 and the metal leads 102, 104, 200 previously described herein, prior to die attachment. The leadframe 1200 also includes additional leads 1202 such as I/O (input/output) leads, leads for reporting telemetry data such as current and/or temperature information, etc. Even more complex IC packages may have leads arranged on all four sides of the package, e.g., in the case of a processor, memory, ASIC (application-specific integrated circuit), power converter or voltage regulator, etc. In each case, the semiconductor packages described herein are configured for top or bottom side cooling, have a single primary thermal conduction path, and are mountable to a board at either the top or bottom side of the package.

Although the present disclosure is not so limited, the following numbered examples demonstrate one or more aspects of the disclosure.

Example 1. A package, comprising: a semiconductor die having a first load terminal at a first side of the semiconductor die and a second load terminal at a second side of the semiconductor die opposite the first side; a metal block attached to the second load terminal of the semiconductor die and providing a single primary thermal conduction path of the package; a first metal lead electrically connected to the first load terminal of the semiconductor die; a second metal lead electrically connected to the second load terminal of the semiconductor die; and a mold compound embedding the semiconductor die, the metal block, and each metal lead, wherein each metal lead and the metal block are exposed from the mold compound at a first side of the package, wherein each metal lead is exposed from the mold compound at a second side of the package opposite the first side, so that the package is configured for surface mounting at either the first side or the second side of the package.

Example 2. The package of example 1, wherein the semiconductor die has a control terminal at the first side of the semiconductor die, the package further comprising: a third metal lead electrically connected to the control terminal of the semiconductor die, wherein the third metal lead is exposed from the mold compound at the first side and at the second side of the package.

Example 3. The package of examples 1 or 2, wherein the first metal lead and the second metal lead are each L-shaped.

Example 4. The package of any of examples 1 through 3, wherein the first metal lead and the second metal lead each have a base and a branch extending from the base, wherein the base of each metal lead is exposed from the mold compound at the first side of the package, and wherein the branch of each metal lead is exposed from the mold compound at the second side of the package.

Example 5. The package of any of examples 1 through 4, wherein the metal block and the second metal lead are fused together or formed integrally to form the electrical connection between the second metal lead and the second load terminal of the semiconductor die.

Example 6. The package of any of examples 1 through 5, wherein the first metal lead has a sidewall which extends from the first side of the package to the second side of the package at a first edge face of the package, wherein the second metal lead has a sidewall which extends from the first side of the package to the second side of the package at a second edge face of the package different from the first edge face, and wherein the sidewall of the first metal lead and the sidewall of the second metal lead are both at least partly exposed from the mold compound.

Example 7. The package of example 6, wherein the part of the sidewall of the first metal lead at least partly exposed from the mold compound is plated, and wherein the part of the sidewall of the second metal lead at least partly exposed from the mold compound is plated.

Example 8. The package of examples 6 or 7, wherein the entire sidewall of the first metal lead is exposed from the mold compound and forms part of the first edge face of the package, and wherein the entire sidewall of the second metal lead is exposed from the mold compound and forms part of the second edge face of the package.

Example 9. The package of any of examples 6 through 8, wherein the part of the sidewall of the first metal lead at least partly exposed from the mold compound is a protuberance such that the sidewall of the first metal lead has an increased local thickness in a region of the protuberance, and wherein the part of the sidewall of the second metal lead at least partly exposed from the mold compound is a protuberance such that the sidewall of the second metal lead has an increased local thickness in a region of the protuberance.

Example 10. A method of producing a package, the method comprising: attaching a second load terminal at a second side of a semiconductor die to a metal block which provides a single primary thermal conduction path of the package, the semiconductor die having a first load terminal at a first side of the semiconductor die opposite the second side; electrically connecting a first metal lead to the first load terminal of the semiconductor die electrically connecting a second metal lead to the second load terminal of the semiconductor die; and embedding the semiconductor die, the metal block, and each metal lead in a mold compound, wherein each metal lead and the metal block are exposed from the mold compound at a first side of the package, wherein each metal lead is exposed from the mold compound at a second side of the package opposite the first side, so that the package is configured for surface mounting at either the first side or the second side of the package.

Example 11. The method of example 10, wherein the semiconductor die has a control terminal at the first side of the semiconductor die, the method further comprising: electrically connecting a third metal lead to the control terminal of the semiconductor die, wherein the third metal lead is exposed from the mold compound at the first side and at the second side of the package.

Example 12. The method of examples 10 or 11, wherein the first metal lead and the second metal lead are each L-shaped.

Example 13. The method of any of examples 10 through 12, wherein the first metal lead and the second metal lead each have a base and a branch extending from the base, wherein the base of each metal lead is exposed from the mold compound at the first side of the package, and wherein the branch of each metal lead is exposed from the mold compound at the second side of the package.

Example 14. The method of any of examples 10 through 13, wherein the metal block and the second metal lead are fused together or formed integrally to form the electrical connection between the second metal lead and the second load terminal of the semiconductor die.

Example 15. The method of any of examples 10 through 14, wherein the first metal lead has a sidewall which extends from the first side of the package to the second side of the package at a first edge face of the package, wherein the second metal lead has a sidewall which extends from the first side of the package to the second side of the package at a second edge face of the package opposite the first edge face, and wherein the sidewall of the first metal lead and the sidewall of the second metal lead are both at least partly exposed from the mold compound.

Example 16. The method of example 15, further comprising: plating the part of the sidewall of the first metal lead at least partly exposed from the mold compound; and plating the part of the sidewall of the second metal lead at least partly exposed from the mold compound.

Example 17. The method of example 15 or 16, wherein the entire sidewall of the first metal lead is exposed from the mold compound and forms part of the first edge face of the package, and wherein the entire sidewall of the second metal lead is exposed from the mold compound and forms part of the second edge face of the package.

Example 18. The method of any of examples 15 through 17, wherein the part of the sidewall of the first metal lead at least partly exposed from the mold compound is a protuberance such that the sidewall of the first metal lead has an increased local thickness in a region of the protuberance, and wherein the part of the sidewall of the second metal lead at least partly exposed from the mold compound is a protuberance such that the sidewall of the second metal lead has an increased local thickness in a region of the protuberance.

Example 19. An electronic assembly, comprising: a package comprising: a semiconductor die having a first load terminal at a first side of the semiconductor die and a second load terminal at a second side of the semiconductor die opposite the first side; a metal block attached to the second load terminal of the semiconductor die and providing a single primary thermal conduction path of the package; a first metal lead electrically connected to the first load terminal of the semiconductor die; a second metal lead electrically connected to the second load terminal of the semiconductor die; and a mold compound embedding the semiconductor die, the metal block, and each metal lead, wherein each metal lead and the metal block are exposed from the mold compound at a first side of the package, wherein each metal lead is exposed from the mold compound at a second side of the package opposite the first side, so that the package is configured for surface mounting at either the first side or the second side of the package; and a substrate to which the package is surface mounted at either the first side or the second side of the package.

Example 20. The electronic assembly of example 19, wherein the first metal lead and the second metal lead each have a base and a branch extending from the base, wherein the base of each metal lead is exposed from the mold compound at the first side of the package, and wherein the branch of each metal lead is exposed from the mold compound at the second side of the package.

Terms such as "first", "second", and the like, are used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A package, comprising:
    a semiconductor die having a first load terminal at a first side of the semiconductor die and a second load terminal at a second side of the semiconductor die opposite the first side;
    a metal block attached to the second load terminal of the semiconductor die and providing a single primary thermal conduction path of the package;
    a first metal lead electrically connected to the first load terminal of the semiconductor die;
    a second metal lead electrically connected to the second load terminal of the semiconductor die; and
    a mold compound embedding the semiconductor die, the metal block, the first metal lead and the second metal lead,
    wherein the first metal lead, the second metal lead and the metal block are exposed from the mold compound at a first side of the package,
    wherein the first metal lead and the second metal lead are exposed from the mold compound at a second side of the package opposite the first side, so that the package is configured for surface mounting at either the first side or the second side of the package.

2. The package of claim 1, wherein the semiconductor die has a control terminal at the first side of the semiconductor die, the package further comprising:
    a third metal lead electrically connected to the control terminal of the semiconductor die,
    wherein the third metal lead is exposed from the mold compound at the first side and at the second side of the package.

3. The package of claim 1, wherein the first metal lead and the second metal lead are each L-shaped.

4. The package of claim 1, wherein the first metal lead and the second metal lead each have a base and a branch extending from the base, wherein the base of the first metal lead and the base of the second metal lead are exposed from the mold compound at the first side of the package, and wherein the branch of the first metal lead and the branch of the second metal lead are exposed from the mold compound at the second side of the package.

5. The package of claim 1, wherein the metal block and the second metal lead are fused together or formed integrally to form the electrical connection between the second metal lead and the second load terminal of the semiconductor die.

6. The package of claim 1, wherein the first metal lead has a sidewall which extends from the first side of the package to the second side of the package at a first edge face of the package, wherein the second metal lead has a sidewall which extends from the first side of the package to the second side of the package at a second edge face of the package different from the first edge face, and wherein the sidewall of the first metal lead and the sidewall of the second metal lead are both at least partly exposed from the mold compound.

7. The package of claim 6, wherein the part of the sidewall of the first metal lead at least partly exposed from the mold compound is plated, and wherein the part of the sidewall of the second metal lead at least partly exposed from the mold compound is plated.

8. The package of claim 6, wherein the entire sidewall of the first metal lead is exposed from the mold compound and forms part of the first edge face of the package, and wherein the entire sidewall of the second metal lead is exposed from the mold compound and forms part of the second edge face of the package.

9. The package of claim 6, wherein the part of the sidewall of the first metal lead at least partly exposed from the mold compound is a protuberance such that the sidewall of the first metal lead has an increased local thickness in a region of the protuberance, and wherein the part of the sidewall of the second metal lead at least partly exposed from the mold compound is a protuberance such that the sidewall of the second metal lead has an increased local thickness in a region of the protuberance.

10. A method of producing a package, the method comprising:
    attaching a second load terminal at a second side of a semiconductor die to a metal block which provides a single primary thermal conduction path of the package, the semiconductor die having a first load terminal at a first side of the semiconductor die opposite the second side;
    electrically connecting a first metal lead to the first load terminal of the semiconductor die;
    electrically connecting a second metal lead to the second load terminal of the semiconductor die; and
    embedding the semiconductor die, the metal block, the first metal lead and the second metal lead in a mold compound,
    wherein the first metal lead, the second metal lead and the metal block are exposed from the mold compound at a first side of the package,
    wherein the first metal lead and the second metal lead are exposed from the mold compound at a second side of the package opposite the first side, so that the package is configured for surface mounting at either the first side or the second side of the package.

11. The method of claim 10, wherein the semiconductor die has a control terminal at the first side of the semiconductor die, the method further comprising:
    electrically connecting a third metal lead to the control terminal of the semiconductor die,
    wherein the third metal lead is exposed from the mold compound at the first side and at the second side of the package.

12. The method of claim 10, wherein the first metal lead and the second metal lead are each L-shaped.

13. The method of claim 10, wherein the first metal lead and the second metal lead each have a base and a branch extending from the base, wherein the base of the first metal lead and the base of the second metal lead are exposed from the mold compound at the first side of the package, and wherein the branch of the first metal lead and the branch of the second metal lead are exposed from the mold compound at the second side of the package.

14. The method of claim 10, wherein the metal block and the second metal lead are fused together or formed integrally to form the electrical connection between the second metal lead and the second load terminal of the semiconductor die.

15. The method of claim 10, wherein the first metal lead has a sidewall which extends from the first side of the package to the second side of the package at a first edge face of the package, wherein the second metal lead has a sidewall which extends from the first side of the package to the second side of the package at a second edge face of the package opposite the first edge face, and wherein the sidewall of the first metal lead and the sidewall of the second metal lead are both at least partly exposed from the mold compound.

16. The method of claim 15, further comprising:
plating the part of the sidewall of the first metal lead at least partly exposed from the mold compound; and
plating the part of the sidewall of the second metal lead at least partly exposed from the mold compound.

17. The method of claim 15, wherein the entire sidewall of the first metal lead is exposed from the mold compound and forms part of the first edge face of the package, and
wherein the entire sidewall of the second metal lead is exposed from the mold compound and forms part of the second edge face of the package.

18. The method of claim 15, wherein the part of the sidewall of the first metal lead at least partly exposed from the mold compound is a protuberance such that the sidewall of the first metal lead has an increased local thickness in a region of the protuberance, and wherein the part of the sidewall of the second metal lead at least partly exposed from the mold compound is a protuberance such that the sidewall of the second metal lead has an increased local thickness in a region of the protuberance.

19. An electronic assembly, comprising:
a package comprising:
a semiconductor die having a first load terminal at a first side of the semiconductor die and a second load terminal at a second side of the semiconductor die opposite the first side;
a metal block attached to the second load terminal of the semiconductor die and providing a single primary thermal conduction path of the package;
a first metal lead electrically connected to the first load terminal of the semiconductor die;
a second metal lead electrically connected to the second load terminal of the semiconductor die; and
a mold compound embedding the semiconductor die, the metal block, the first metal lead and the second metal lead,
wherein the first metal lead, the second metal lead and the metal block are exposed from the mold compound at a first side of the package,
wherein the first metal lead and the second metal lead are exposed from the mold compound at a second side of the package opposite the first side, so that the package is configured for surface mounting at either the first side or the second side of the package; and
a substrate to which the package is surface mounted at either the first side or the second side of the package.

20. The electronic assembly of claim 19, wherein the first metal lead and the second metal lead each have a base and a branch extending from the base, wherein the base of the first metal lead and the base of the second metal lead are exposed from the mold compound at the first side of the package, and wherein the branch of the first metal lead and the branch of the second metal lead are exposed from the mold compound at the second side of the package.

* * * * *